United States Patent [19]

Hopwood et al.

[11] 3,993,962
[45] Nov. 23, 1976

[54] LOW NOISE PARAMETRIC VARACTOR DIODE CRYSTAL OSCILLATOR

[75] Inventors: Francis W. Hopwood, Severna Park; Lester K. Staley, Baltimore; Thomas R. Turlington, Linthicum, all of Md.

[73] Assignee: The United States of America as represented by the Secretary of the Air Force, Washington, D.C.

[22] Filed: Aug. 18, 1975

[21] Appl. No.: 606,041

[52] U.S. Cl. .................................. 331/18; 331/30; 331/76; 331/107 R; 331/139; 331/158; 331/172

[51] Int. Cl.² ...................... H03B 3/04; H03B 5/36; H03B 5/38; H03B 25/00

[58] Field of Search ............. 331/18, 25, 30, 107 R, 331/116 R, 139, 158, 172, 173, 76; 330/4.9

[56] References Cited
UNITED STATES PATENTS 3,401,354   9/1968   Seidel ............................ 330/4.9 X Primary Examiner—Siegfried H. Grimm
Attorney, Agent, or Firm—Joseph E. Rusz; George Fine

[57] ABSTRACT

A low noise frequency source utilizes a varactor diode to form a parametric crystal oscillator which may be frequency multiplied to the desired microwave frequency, for radar applications.

3 Claims, 3 Drawing Figures

LOW NOISE PARAMETRIC VARACTOR DIODE CRYSTAL OSCILLATOR

BACKGROUND OF THE INVENTION

The performance of modern airborne radars in a high clutter environment is known to be limited by the "flicker" noise associated with the spectrum of even the highest quality solid state frequency sources. The radar degradation is due to the phenomenon known as "clutter spreading" wherein the spectrum of the received clutter is effectively widened by the flicker modulations on the receiver local oscillator signal. The widened clutter spectrum then overshadows small desired targets in adjacent doppler bands thus preventing their detection by the radar. This continues to be a serious problem in airborne radars since the performance of other system components has advanced to the point where the noise performance of the microwave frequency source presents a basic limitation to system performance in a clutter environment.

Herein described is a frequency source wherein the flicker noise is essentially eliminated, thereby allowing system requirements to be met with adequate margin and without the need for carefully screened components.

There is described a parametric crystal oscillator which can be frequently multiplied to the desired microwave frequency for radar applications. However, the techniques described for realizing low noise oscillation are by no means limited to the crystal oscillator application but are applicable to other types of oscillators. In particular, the techniques can be applied to cavity stabilized microwave oscillators where the problem of flicker noise and of voltage tuning without noise degradation are severe.

The general mechanisms which determine oscillator phase noise are well understood. The phase noise of a device is commonly described by the quantity $L(F)$ which is defined as the ratio of the phase noise power on one side of a carrier, at frequency F removed from the carrier, to the carrier power, per unit band-width. Usually $L(F) << 1$.

In general, oscillators consist of a frequency determining resonator and some amplifier or negative resistance device known as a sustaining circuit. The sustaining circuit must employ some means to limit the amplitude of the oscillation to a steady state level. This is accomplished by some nonlinearity in the sustaining circuit. In circuits involving the transfer of power between (not necessarily harmonically related) frequencies the oscillation amplitude can be a function of the available power at some input or "pump" frequency.

The important considerations regarding the noise performance of an oscillator are: the inherent noise of the sustaining circuit; the bandwidth of the loaded resonator; and the amount of excess gain or excess negative resistance of the sustaining circuit and its behavior in the limiting process.

There exists phase noise in a high quality transistor crystal oscillator designed for doppler radar applications. The sustaining circuit contains both flicker and thermal noise sources. The thermal noise represents an effective noise figure and is additive in nature so long as the nonlinearities in the crystal and sustaining circuit are small. The flicker noise component decreases at 10 db/decade and is multiplicative in that its ratio of signal power to carrier power is essentially independent of carrier power. It has been observed that the flicker noise decreases from about $-115 db\sqrt{\ }HZ$ at 1 HZ for many devices. This observation has been verified many times although there has been success at reducing its effects by the application of video and RF negative feedback.

It is well known that the oscillator phase noise is that of its sustaining circuit modified by a function. (The thermal noise of the resonator losses are lumped in with the sustaining circuit noise.) Above the half bandwidth of the loaded resonator the oscillator noise is that of the sustaining circuit, while below the half bandwidth the oscillator noise rises at 6 db/octave faster than the sustaining circuit with decreasing frequency.

The phase spectrum of the transistor crystal oscillator shows that unless the thermal noise is very large the low frequency phase noise of the transistor crystal oscillator is determined by the sustaining circuit flicker noise and the loaded resonator bandwidth. This low frequency flicker noise remains as a basic problem with the transistor crystal oscillator and thus with the clutter performance of airborne radars.

The desirable properties of a low noise oscillator are then: its flicker noise should be small or nonexistent; the circuit should not significantly degrade the resonator bandwidth; and the ratio of signal power to thermal noise should be large. A new circuit configuration having these desirable properties is the object of this invention.

The varactor diode finds many applications in RF circuitry. Its uses include frequency multipliers and dividers, parametric amplifiers, frequency converters, the voltage tuning of resonators, and other applications.

An observed property of the varactor diode is that under certain conditions of bias and RF drive, it exhibits little or no flicker noise.

The invention described herein utilizes a varactor diode to form a parametric crystal oscillator which is essentially free of flicker noise along with means to derive large useful power from the parametric oscillator without the introduction of substantial flicker noise and without introducing substantial degradation of the resonator bandwidth.

SUMMARY OF THE INVENTION

A low noise frequency source for radar applications is provided. A varactor diode is utilized to form a parametric crystal oscillator which has a signal port, pump port, and idler port. In order to preserve resonator Q no useful power is withdrawn from the parametric oscillator at the signal frequency. A signal taken at the idler port is noisy in that it is the difference between the generally noisy pump and the low noise signal frequency oscillation. This noise is removed by the addition of phase locked pump apparatus. The phase lock apparatus is the means by which useful power is obtained from the parametric oscillator without the introduction of flicker noise.

Figure 1:
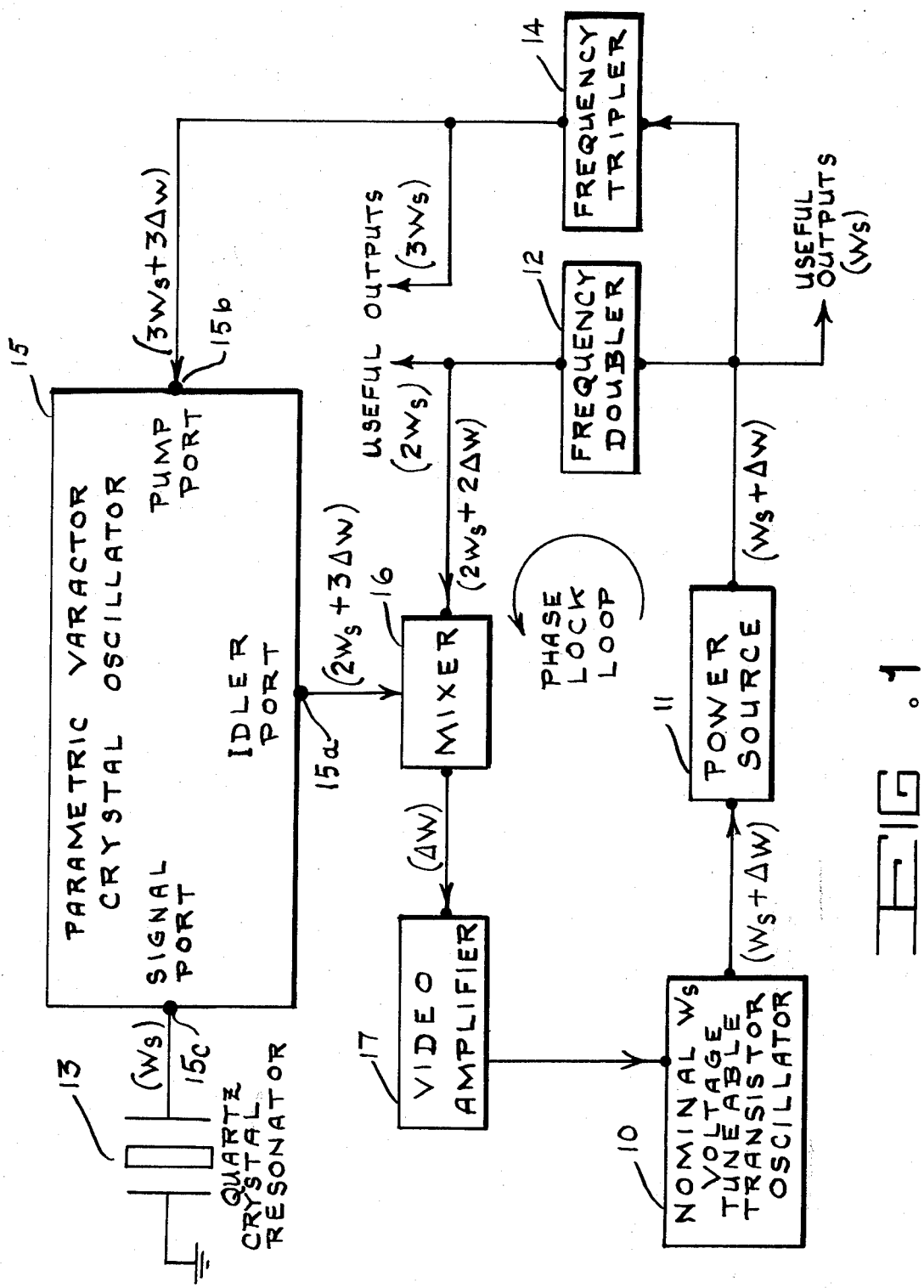
FIG. 1 illustrates a preferred embodiment of the low noise parametric frequency source in block diagram form.
Figure 2:
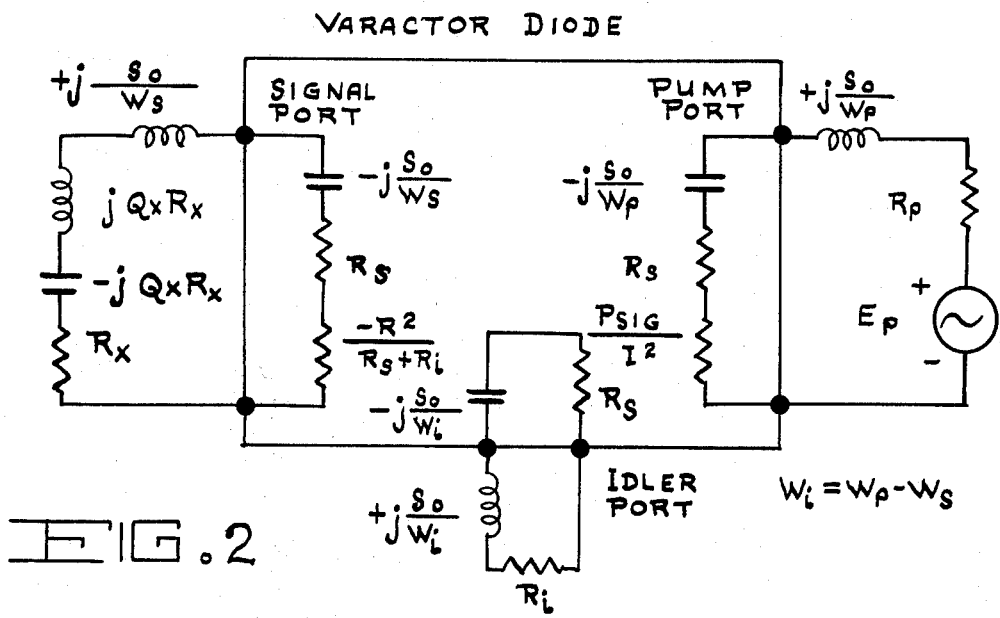
FIG. 2 shows the equivalent circuit of the parametric varactor crystal oscillator of FIG. 1.

Now referring first to FIG. 2 which is an equivalent circuit of the parametric oscillator shown in component 15 of FIG. 1, the parametric crystal oscillator uses the known negative resistance properties of the varactor diode. These properties are summarized in FIG. 2 where:

$$Z_s = R_s - \frac{R^2}{R_s + R_i} - j\frac{S_o}{W_s}$$

$$Z_i = R_s - j\frac{S_o}{W_i}$$

$$Z_p = R_s + \frac{P_{SIG}}{I^2} - j\frac{S_o}{W_p}.$$

$Z_s$, $Z_i$, $Z_p$ are the diode impedances at the signal, idler, and pump frequencies;
$R_s$ is the diode series resistance;
$S_o$ is the diode average elastance;
p is the ratio of the pump current to that which would cause conduction;
$P_{SIG}$ is the signal frequency power;
$P_i$ is the idler power;
$R_x$ is the crystal series resistance; and
$V_o$ is the static voltage corresponding to $S_o$ (this is not the applied bias voltage).

$$I = \frac{pV_o}{S_o}\sqrt{2W_s W_p}$$

$$R = \frac{pS_o}{2}\bigg/\sqrt{W_s W_i}.$$

These equations describe the diode impedances when the idler circuit is resonated.

When the crystal is oscillating the pump current adjusts itself so that:

$$\frac{-R^2}{R_i + R_s} + R_s + R_x = 0.$$

This defines the diode parameters for sustained oscillation.

In order to preserve resonator Q no useful power is withdrawn from the parametric oscillator at the signal frequency. If low loss reactive components are used, the dominant loss of resonator Q is then due to the diode series resistance. This results in almost negligible Q degradation compared to what has been demonstrated in VHF transistor oscillators. Useful power is taken not at the signal frequency but at the idler frequency, which is the difference between the generally noisy pump and the low noise signal frequency. The reason for this comes from the expression for the signal frequency negative resistance. The term $R_i$ is the idler load resistance into which useful power is delivered. The introduction of positive idler resistance into the idler circuit serves only to modify the negative resistance seen by the crystal but if the diode series resistance is small it has little effect on the resonator Q. The ratio of idler power to signal power is $W_i/W_s$. When $W_i = 2W_s$, the idler power is twice the signal power, which is essentially the crystal dissipation. If this same power were withdrawn at the signal frequency the resonator Q should be decreased by two-thirds with a resulting increase in low frequency noise. It is noted that simply taking less power at the signal frequency is not equivalent because the usable signal to thermal noise ratio is thereby decreased, and more important, the flicker noise of the amplifier would be introduced, thereby at least partially negating the noise advantages of the invention.

The signal taken at idler port 15a is noisy in that it is the difference between the generally noisy pump and the low noise signal frequency oscillation at pump port 15b and signal port 15c, respectively. This noise is easily removed by the addition of the phase locked pump apparatus described in FIG. 1. This phase lock apparatus is the means by which useful power is obtained from the parametric oscillator without the introduction of flicker noise. It consists of voltage controlled transistor oscillator 10 and power amplifier 11, followed by low noise varactor frequency doubler 12 and similar tripler 14. Transistor oscillator 10 and power amplifier 11 are at the same frequency ($W_s$) as the parametric oscillation supplied by quartz crystal resonator 13 of parametric varactor diode crystal oscillator 15 and has a noisy open loop frequency spectrum described as $\Delta W(T)$. The instantaneous open loop frequency at the power amplifier output is then ($W_s + \Delta W$). This frequency is tripled without the addition of substantial noise to the pump frequency ($W_p = 3W_s + 3\Delta W$). The idler frequency output is the difference between this and $W_s$, giving an idler frequency of $2W_s + 3\Delta W$. This is mixed in mixer 16 with the doubler output $2W_s + 2\Delta W$ to give a video error signal $\Delta W$. This is the noise of the transistor oscillator and power amplifier relative to the parametric oscillation. The mixer output proportional to $\Delta W$ is amplified by low noise video amplifier 17 and applied to the transistor oscillator tuning port, thereby forming a phase lock loop. The noise spectrum is thus reduced by the large loop gain so that the power amplifier output takes on the low noise spectrum of the parametric oscillation. Final useful output may be taken at either power amplifier 11 or doubler 12 or tripler 14 as desired.

The dominant phase noise sources are the thermal noise of the crystal series resistance and diode losses, the reactive component losses (usually small), the noise figure of the mixer and video amplifier (a major contributor) and the thermal noise associated with the diode negative resistance. The effective noise temperature of the latter is increased by the ratio of the idler to signal frequencies. It can be shown that the phase noise of these sources can be expressed as:

$$L(w) = 10 \log \left[\frac{KT_o}{P_{SIG}}\right] \left[\left(1 + \frac{W_i}{W_s}\right)\left(\frac{W_s}{2Q_L W_m}\right) + \frac{FW_s}{W_p}\right]$$

where
K is Boltzmann's constant;
$T_o$ is the diode temperature;
$P_{SIG}$ is the signal frequency power;
F is the video amp/mixer noise figure;
$W_m$ is the modulation frequency
$W_{s,i,p}$ are the signal, idler, pump frequencies. The transition between constant "frequency" noise and constant "phase" noise occurs at $$W_{mo} = \left[\frac{W_s}{2FQ_L}\right]\left[1 + \frac{W_s}{W_s}\right]$$

It has been suggested that additional phase noise might be contributed by the "folding" due to harmonic currents. A similar problem contributes somewhat to the high frequency noise of transistor oscillators. The effect is reduced by the use of the balanced oscillator configuration described later with reference to FIG. 3.

The absence of flicker noise is dependent upon not drawing forward diode current. One might assume that the parametric oscillation must build up to a steady state wherein limiting occurs due to the onset of forward conduction, thus introducing flicker noise. This is not the case. Theory shows that the oscillation level is wholly a function of available pump power and it is not required that forward conduction occur. This has been substantiated in laboratory measurements where a sustained oscillation with crystal dissipation of −3DBM results in conduction current of less than $10^{-8}$ amperes. However, care must be taken in the mechanization that mistuning and resultant pump overdrive do not cause diode conduction.

The effects of pump amplitude and frequency modulation on the parametric oscillator spectrum have been examined in detail and are summarized hereinafter.

In the case of AM to FM conversion for sustained oscillation, the pump current is fixed and independent of available pump power, above some power threshold that defines the onset of oscillation and for oscillation levels less than that which cause forward conduction. Since the reactance at the signal port is a function of pump current which is fixed it is essentially independent of pump available power amplitude modulation. AM to FM conversion is therefore negligible for the case of sustained oscillation. It is recognized that this is different from the parametric amplifier case where the signal port reactance is a function of pump amplitude with resulting AM to FM conversion.

For the case of AM to AM conversion, the magnitude of AM to AM conversion is dependent upon the impedance match at the pump input. If the pump is badly mismatched with a too-high source resistance, the oscillation amplitude is strongly dependent on pump available power and pump AM is enhanced. Then small changes in pump power result in large changes in oscillation amplitude and can indeed stop the oscillation completely. If, however, the pump is matched to the varying part of the diode pump impedance ($P_{SIG}/I^2$), pump AM appears directly as oscillation AM, DB for DB. If the pump is mismatched with too low a source impedance, pump AM is suppressed. It is assumed for convenience that the diode losses and reactive component losses are lumped as part of the pump source impedance.

For the case of FM to FM conversion, in the absence of phase locking, FM on the pump causes effective idler mistuning and resultant frequency modulation of the parametric oscillation. Theory predicts and measurements verify an 80 DB suppression of FM to FM. With the phase locking, this effect shows up as a negligibly small ($3 \times 10^{-4}$) change in loop gain.

For the case of FM to FM, phase locking the pump makes this effect insignificant.

It is noted that at very low frequencies, the phase noise falls at 20 dB/decade and is due to thermal noise within the parametric crystal oscillator and the loaded resonator Q. Above $W_{mo}$ and below the phase lock bandwidth, the noise is due to the mixervideo amp noise figure and loop gain. Above the loop bandwidth, the noise assumes that of the open loop transistor oscillator and power amplifier.

Practical utilization of the parametric crystal oscillator requires that means be employed to "steer" the various diode currents into the appropriate ports either by frequency filtering or symmetry or other means.

Figure 3:
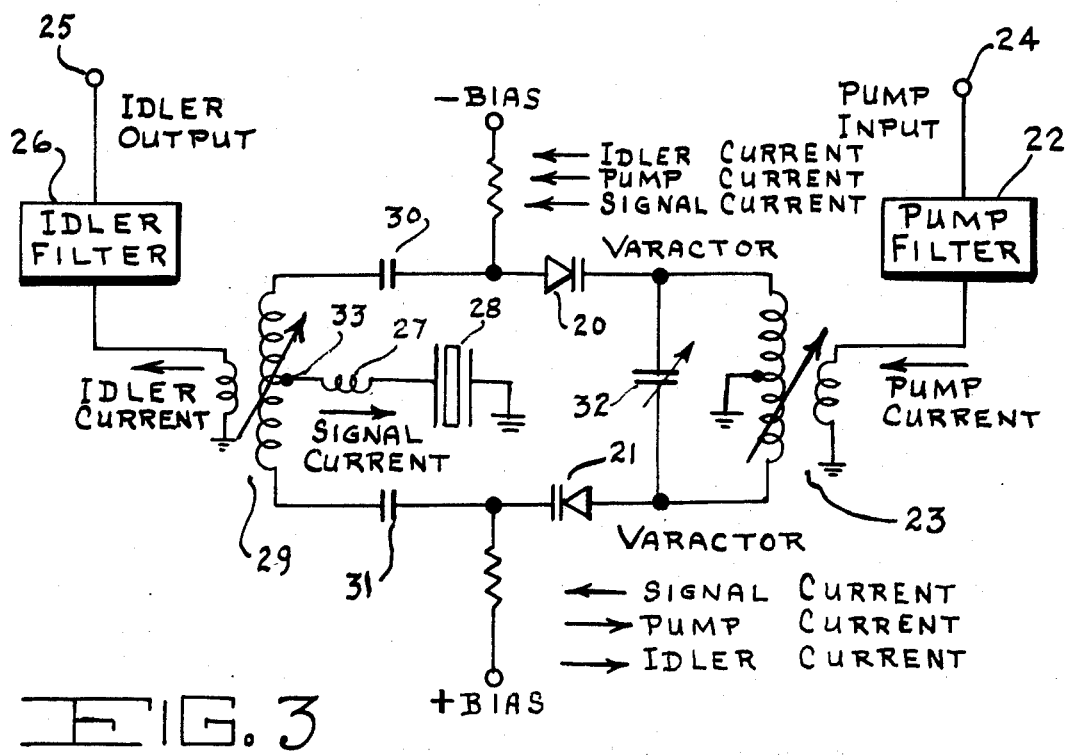
FIG. 3 shows partly in schematic and partly in block form a preferred embodiment of the parametric crystal oscillator of FIG. 1.

One means of accomplishing this is the balanced diode configuration shown in FIG. 3. In this embodiment the pump current is introduced to varactor diodes 20 and 21 by means of pump filter 22 and variable balanced transformer 23. Pump current flows in opposite directions through the top and bottom diodes 20 and 21, respectively, as does the idler current. Signal current flows in the same direction through both diodes and does not appear at either the pump or idler port 24 or 25, respectively, by virtue of symmetry. Idler frequency is rejected by pump filter 22 and pump frequency is rejected by idler filter 26 to accomplish the required frequency separation. Inductor 27 in series with crystal 28 at signal port 33 forces the oscillation to approximately the crystal series resonant frequency. It is noted that the effects of the crystal case capacitance must be included here. It is noted variable balanced transformer 29 is utilized in the idler circuit. Fixed capacitors 30 and 31 are utilized to block the DC and variable capacitance 32 for firing timing.

The hereinbefore described parametric crystal oscillator embodiment has the advantage of being essentially free of flicker noise. In addition, the embodiment introduces almost negligible degradation of crystal Q compared to transistor oscillators. These combine to offer improved low frequency phase noise performance.

What is claimed is:

1. A low noise parametric frequency source for radar applications being comprised of a parametric varactor diode crystal oscillator utilizing the negative resistance properties of the varactor diode, said varactor diode crystal oscillator having a signal port, a pump port and an idler port, a quartz crystal resonator connected to ground from said signal port, a phase lock apparatus for said parametric varactor diode crystal oscillator connected between said pump port and said idler port to remove the noisy signal at said idler port, said phase lock apparatus comprised of a voltage controlled transistor oscillator, a power amplifier in series therewith, said voltage controlled transistor oscillator, power amplifier, and quartz crystal resonator being at the same frequency, $W_s$, a low noise frequency doubling means connected to the output of said power amplifier, low noise frequency tripling means interconnecting the output of said power amplifier and said pump port, mixer means receiving simultaneously the output signals from said idler port and said low noise frequency doubling means, and a video amplifier interconnecting the output from said mixer to the input of said voltage tuneable transistor oscillator, useful output signals from the low noise parametric source being available at the outputs of said power amplifier, said low noise frequency doubling means, and said low noise frequency tripling means.

2. A low noise parametric frequency source as described in claim 1 wherein said parametric varactor diode crystal oscillator is comprised of a first variable balanced transformer having an input winding and a first center tapped winding, said first center tapped winding having first and second outer terminals, a pump filter interconnecting said pump port and said first input winding, a second variable balanced transformer having a second center tapped winding and an output winding, said second center tapped winding having first and second outer terminals, an idler filter interconnecting said output winding and said idler port, a quartz crystal resonator, an inductor connected in series arrangement with said quartz crystal resonator, said series arrangement interconnecting the center tap of said second center tapped winding and ground, a first varactor diode and a first capacitor in a first series arrangement interconnecting said first outer terminals of said first and second center tapped windings, a second varactor diode and a second capacitor in a second series arrangement interconnecting said second outer terminals of said first and second center tapped windings, said first and second varactor diodes being oppositely poled, and first and second means to bias said first and second varactor diodes, respectively.

3. A low noise parametric frequency source as described in claim 2 further including a variable capacitor parallel connected to said first center tapped winding.

* * * * *